United States Patent
Christensen et al.

(10) Patent No.: US 6,429,099 B1
(45) Date of Patent: Aug. 6, 2002

(54) IMPLEMENTING CONTACTS FOR BODIES OF SEMICONDUCTOR-ON-INSULATOR TRANSISTORS

(75) Inventors: Todd Alan Christensen, Rochester; John Edward Sheets, II, Zumbrota, both of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/478,037

(22) Filed: Jan. 5, 2000

(51) Int. Cl.[7] .......................... H01L 21/20; H01L 21/36
(52) U.S. Cl. ...................... 438/480; 438/233; 438/407; 438/423; 438/967
(58) Field of Search .................... 438/149, 151, 438/162, 233, 967, 766, 407, 423–424, 480

(56) References Cited

U.S. PATENT DOCUMENTS

| | | | |
|---|---|---|---|
| 4,396,933 A | | 8/1983 | Magdo et al. ............... 257/518 |
| 4,778,775 A | * | 10/1988 | Tzeng ......................... 438/214 |
| 4,814,287 A | | 3/1989 | Takemoto et al. ........... 438/234 |
| 5,008,723 A | | 4/1991 | van der Have ............. 257/386 |
| 5,494,846 A | * | 2/1996 | Yamazaki .................... 438/407 |
| 5,559,368 A | | 9/1996 | Hu et al. ..................... 257/369 |
| 5,670,388 A | | 9/1997 | Machesney et al. ......... 438/164 |
| 5,712,173 A | * | 1/1998 | Liu et al. ..................... 438/297 |
| 5,804,858 A | | 9/1998 | Hsu et al. .................... 257/347 |
| 5,811,855 A | | 9/1998 | Tyson et al. ................. 257/349 |
| 5,818,085 A | | 10/1998 | Hsu et al. .................... 257/347 |
| 5,821,575 A | | 10/1998 | Mistry et al. ............... 257/281 |
| 5,877,046 A | | 3/1999 | Yu et al. ...................... 438/151 |
| 5,889,293 A | | 3/1999 | Rutten et al. .................. 257/74 |
| 5,945,712 A | * | 8/1999 | Kim ............................. 257/347 |
| 5,956,597 A | * | 9/1999 | Furukawa et al. ........... 438/405 |
| 6,100,159 A | * | 8/2000 | Krivokapic .................. 438/413 |
| 6,121,659 A | * | 9/2000 | Christensen et al. ........ 257/347 |
| 6,215,155 B1 | * | 4/2001 | Wolleson ..................... 257/351 |

* cited by examiner

Primary Examiner—Carl Whitehead, Jr.
Assistant Examiner—Jamie L. Brophy
(74) Attorney, Agent, or Firm—Karuna Ojanen

(57) ABSTRACT

A method and semiconductor structure are provided for implementing body contacts for semiconductor-on-insulator transistors. A bulk semiconductor substrate is provided. A mask is applied to the bulk semiconductor substrate to block an insulating implant layer in selected regions. The selected regions provide for body contact for transistors. Holes are formed extending into the bulk semiconductor substrate. The holes are filled with an electrically conductive material to create stud contacts to the bulk semiconductor substrate. In the preferred embodiment, the semiconductor-on-insulator is silicon on an oxide insulating layer and the invention provides a body contact for SOI transistors.

8 Claims, 6 Drawing Sheets

IMPLEMENTING CONTACTS FOR BODIES OF SEMICONDUCTOR-ON-INSULATOR TRANSISTORS

RELATED APPLICATION

Related U.S. patent applications include Ser. No. 09/478,036 filed Jan. 5, 2000, and its divisional application Ser. No. 09/870,754 filed May 31, 2001 by Todd Alan Christensen and John Edward Sheets II which is owned by the assignee herein and which is hereby incorporated by reference in its entirety.

FIELD OF THE INVENTION

The present invention relates to a method to implement body contacts of transistors on semiconductor-on-insulator, especially silicon-on-insulator (SOI), semiconductor technology.

DESCRIPTION OF THE RELATED ART

Metal Oxide Semiconductor Field Effect Transistor (MOSFET) scaling on bulk silicon has been the primary focus of the semiconductor and microelectronic industry for achieving Complementary Metal Oxide Semiconductor (CMOS) chip performance and density objectives. The shrinking of MOSFET dimensions for high density, low power and enhanced performance requires reduced power supply voltages. Because power consumption is a function of capacitance, voltage, and transition frequency, the focus has been on reducing both the capacitance and the voltage as the switching frequency increases. As a result, dielectric thickness and channel length are scaled with power supply voltage. Power supply reduction continues to be the trend for future low voltage CMOS, however, transistor performance is severely impacted by both junction capacitance and the MOSFET body effect at lower voltages. As technologies scale below 0.25 μm channel lengths, to 0.15 μm and 0.1 μm and shorter, short channel effects control, gate resistance, channel profiling and other barriers become an issue for advanced CMOS technologies. While significant success has been achieved with successive scaling of bulk CMOS technology, the manufacturing control issues and power consumption will become increasingly difficult.

Silicon-on-insulator (SOI) technology is an enhanced silicon technology in which an insulating layer is situated above the bulk CMOS layer. SOI transistors are built in a thin layer of silicon on top of a buried insulator, typically silicon oxide or glass, with bulk silicon below the buried insulator. Using SOI technology eliminates many of the concerns and obstacles of bulk silicon CMOS at low power supply voltages. SOI has significant advantages over bulk CMOS technology and will achieve the scaling objectives of low power and high switching frequency for future technologies. SOI provides low power consumption, low leakage current, low capacitance diode structures, good sub-threshold I/V (current/voltage) characteristics, a low soft error rate from both alpha particles and cosmic rays, good SRAM access times, to name only some of the technology benefits offered by SOI. Because of these advantages, SOI technology is especially useful in portable and wireless applications.

SOI technology allows for the mapping of standard advanced technologies into an SOI technology without significant modifications. SOI process techniques include epitaxial lateral overgrowth, lateral solid-phase epitaxy and full isolation by porous oxidized silicon. SOI networks can be constructed using the semiconductor process of techniques of separation by implanted oxygen and wafer-bonding and etch-back because they achieve low defect density, thin film control, good minority carrier lifetimes and good channel mobility characteristics. Structural features are defined by shallow-trench isolation. Shallow trench isolation eliminates planarity concerns and multidimensional oxidation effects, thereby allowing technology migration and scaling to sub-0.25 μm technologies.

FIGS. 1 and 2 illustrate a conventional SOI transistor. FIG. 1 illustrates a cross section through the width of a traditional SOI transistor. The SOI transistor has a polysilicon gate, a gate oxide over a thin silicon layer with isolation oxide, over a buried oxide, over the bulk silicon substrate. Performance of SOI transistors is increased because reduced diffusion capacitance and floating body properties result in lower transistor threshold voltages. Because the voltage of the floating body can vary over time, the threshold voltage also varies. The floating body effects were considered beneficial because of the increased speed at which a transistor can switch. Performance, however, cannot be predicted using transistors in which the bodies are allowed to float. Floating body transistors, moreover, are extremely sensitive to nonperfect input voltage on the gates and to noise. Because of "history effects", moreover, floating body transistors are difficult to match, in part because of this sensitivity described above and in part because the voltage on the floating body is dependent upon previous cycles and the time durations of the cyclic input. For instance, a high signal immediately after two or three other high signals might be output too fast in order to synchronize with other signals. Similarly, a low signal immediately after two or three high signals might be too slow.

In situations and circuits in which the effects associated with floating bodies are undesirable, there are known structures that can be used to connect the body of the SOI transistor to a known voltage. However, the known structures add much capacitance to the device, particularly gate capacitance, thus degrading the performance of these transistors so that is worse than a traditional bulk transistor. FIG. 2 illustrates a traditional body contact of a SOI transistor. Increased polysilicon area is needed to fabricate the traditional body contact. The increased polysilicon results in a large increase in capacitance of the SOI transistor, thus degrading performance.

In the past, electrically connecting the transistor body to a fixed voltage typically increased the size of SOI devices and as such it was considered undesirable. Other attempts have been made to allow body contact with non-uniformly doped channel regions, however, the use of non-uniformly doped channel regions may cause the devices' threshold voltage to change. Other techniques to contact the body of SOI transistors to a voltage are complex and involve multiple process steps using multiple films. These techniques, however, may exacerbate the problem because transistors bodies have high electrical resistance which generates heat. When switching transistors at high frequencies on the order of gigahertz, or once every tens, rather than hundreds of picoseconds, the resistance resulting from large contacts to the transistor bodies causes delay in the transitions because of the resistance-capacitive delay and it is difficult to keep the body at a fixed voltage, especially at ground voltage.

Existing SOI transistors with body contacts require significantly more physical area than their counterpart transistors not having body contacts. Conventional body contacts involving a large "T" or "L" shaped gate where the horizontal layout segment(s) separate the active body region from the body contact region increase the total transistor physical area on the order of fifty percent. Given the same input signal on a non-body contacted transistor and depending on transistor width, the added gate area required by body contacts for SOI transistors typically doubles the total gate capacitance requiring twice the input rise time. The increased area and/or delay penalty render the body-contacted SOI transistors less desirable.

And yet another undesirable result of traditional body contacts in a SOI transistor is a large resistance between the electrical connection between the desired power grid, typically ground for a NFET body, and the actual body itself. Because the connection is through thin lightly doped semiconductor levels, resistances on the order of tens of thousands of ohms are typical.

There is thus a need in the semiconductor-on-insulator industry for a body contact that can operate at high frequencies but does not have high capacitance nor high resistance,

SUMMARY OF THE INVENTION

A principal object of the present invention is to provide a method and semiconductor structure fabricated using the method for implementing body contacts for semiconductor-on-insulator transistors. Other important objects of the present invention are to provide such a method and semiconductor structure for implementing body contacts for silicon-on-insulator (SOI) transistors without substantial negative effect and that overcome many of the disadvantages of prior art arrangements.

A method for implementing body contacts for semiconductor-on-insulator transistors is disclosed which comprises the steps of providing a bulk semiconductor substrate; implanting an insulator to the bulk semiconductor substrate to create a buried insulating layer while applying a mask to block the implantation in selected regions; the selected regions used to form body contacts for the transistors; forming holes extending into the buried insulating layer and the bulk semiconductor substrate; and filling the holes with an electrically conductive material to create stud contacts to the bulk semiconductor substrate. The steps of applying the mask to the selected regions and of implanting an insulator creates the buried insulating layer with the masked selected regions to create openings aligned with bodies of the transistors. The step of forming holes into the buried insulating layer and the bulk semiconductor substrate includes the step of etching holes into the buried insulating layer and the bulk semiconductor substrate.

In a preferred embodiment, the semiconductor is silicon, the implanted insulator is oxygen and the buried insulating layer is a buried oxide layer, and the step of filling the etched holes with an electrically conductive material to create stud contacts to a bulk silicon substrate includes the step of filling the holes with tungsten to create stud contacts to the bulk silicon substrate. The etched holes may also be filled with copper; or aluminum; gold; or a doped semiconductor to create stud contacts to the bulk semiconductor substrate.

The invention may also be realized by a method for implementing body contacts for silicon-on-insulator (SOI) transistors comprising the steps of providing a bulk silicon substrate; applying a mask to selected regions of the bulk silicon substrate; implanting oxygen to create a buried oxide layer above the bulk silicon substrate; the masked selected regions to create openings aligned with bodies of the transistors for body contacts of the SOI transistors; etching holes extending into the buried oxide insulator layer and the bulk silicon substrate; and filling the holes with an electrically conductive material selected from the group consisting of tungsten, copper, aluminum, gold, and doped semiconductor to create stud contacts to the bulk semiconductor substrate. The invention also extends to an integrated circuit having a silicon-on-insulator device made by the method above.

The invention may also be considered a semiconductor structure for implementing body contacts for silicon-on-insulator (SOI) transistors comprising a bulk silicon substrate having SOI transistors formed on the bulk silicon substrate; a patterned oxygen implant layer in which the oxygen implant is blocked in selected regions; the selected regions to provide body contact for the SOI transistors; and electrically conductive contacts extending into the bulk silicon substrate. The semiconductor structure also includes connections for a selected voltage potential connected to the electrically conductive contacts extending into the bulk silicon substrate.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Having reference now to the drawings, in FIGS. 3 through 6, there are shown exemplary sequential steps for implementing body contacts for transistors in a semiconductor-on-insulator technology, preferably silicon-on-insulator (SOI) technology in accordance with the preferred embodiment. A contact to the body of the transistor is provided while maintaining performance advantage and without requiring any additional silicon area.

In accordance with features of the invention, the body contact of the preferred embodiment is provided from underneath the transistor body through the buried insulating layer and the buried bulk semiconductor. By patterning the buried insulating layer, direct electrical connects from the bulk semiconductor up to the regions that will become the bodies of the transistors are provided.

Figure 3:
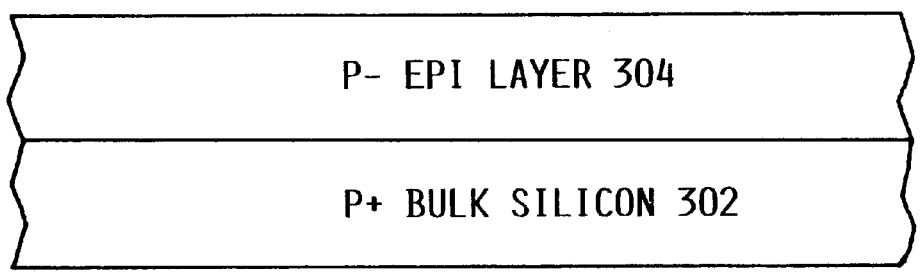
FIGS. 3 through 6 are simplified diagrams of the process for implementing body contacts for semiconductor-on-insulator transistors in accordance with principles of the invention. It is suggested that FIG. 6 be printed on the cover of the patent.

Referring now to FIG. 3, in the preferred embodiment, a blank P+/P–Epi doped silicon substrate including a bulk silicon 302 doped with P+, i.e., approximately $10^{20}$ to $10^{21}$ acceptor atoms, such as boron, and a P–Epi layer 304 of approximately $10^{15}$ to $10^{16}$ acceptors atoms per cubic centimeter can be used to create a structure of the invention. It should be understood that any semiconductor-on-insulator technology having a semiconductor insulator on the same or different semiconductor stack is possible to incorporate the body contacts of the invention herein. It will be appreciated, moreover, that if silicon technology is used, a blank N+/N–Epi doped silicon substrate can also be used to create a structure of the invention.

Figure 4:
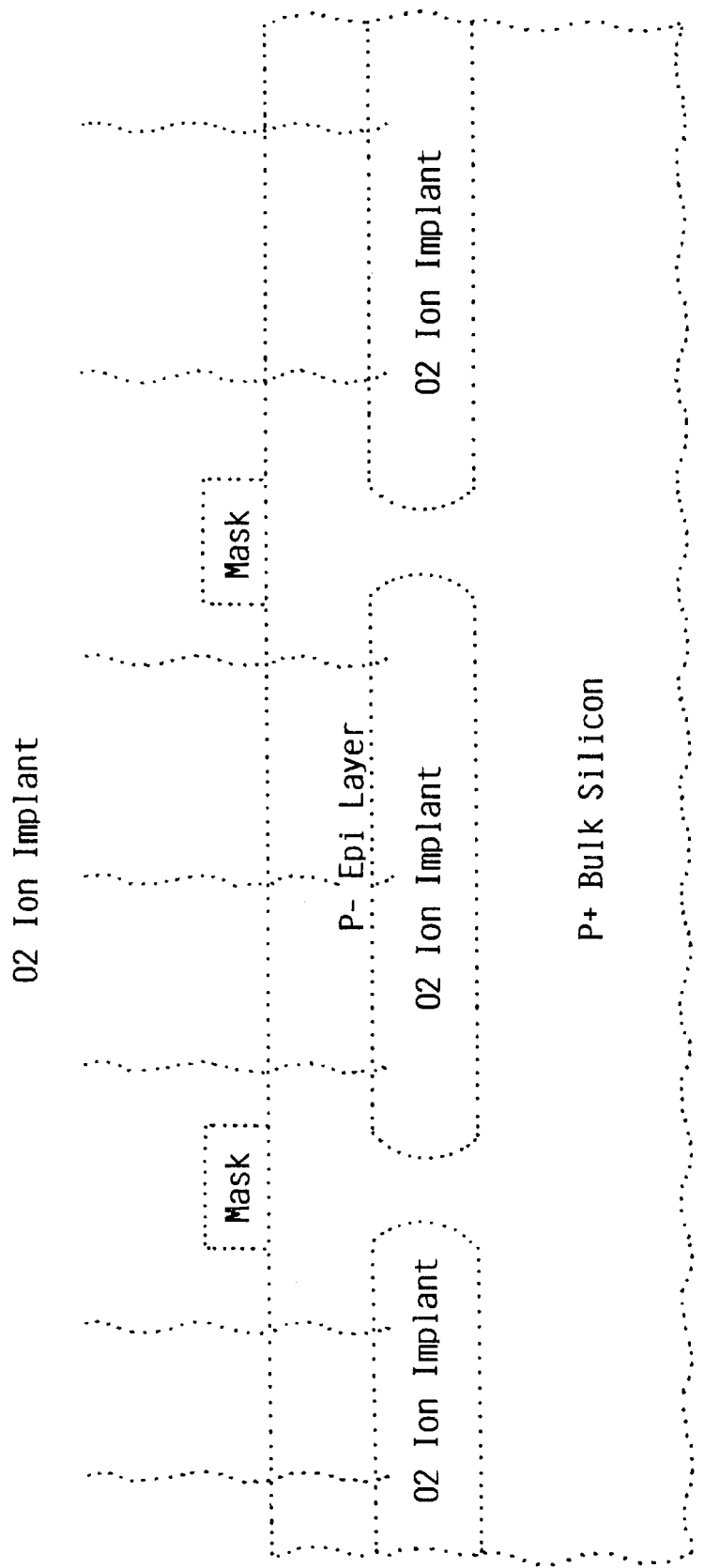

Referring to FIG. 4, the insulating oxide formation is undesirable at the positions of the conductive body contacts 504 so a patterned mask is applied to define a plurality of openings or regions 504. The openings 504 become the body contacts in the bulk silicon layer 302. An appropriate insulator, such as oxygen, is implanted to create the buried insulating layer 502.

Figure 5:
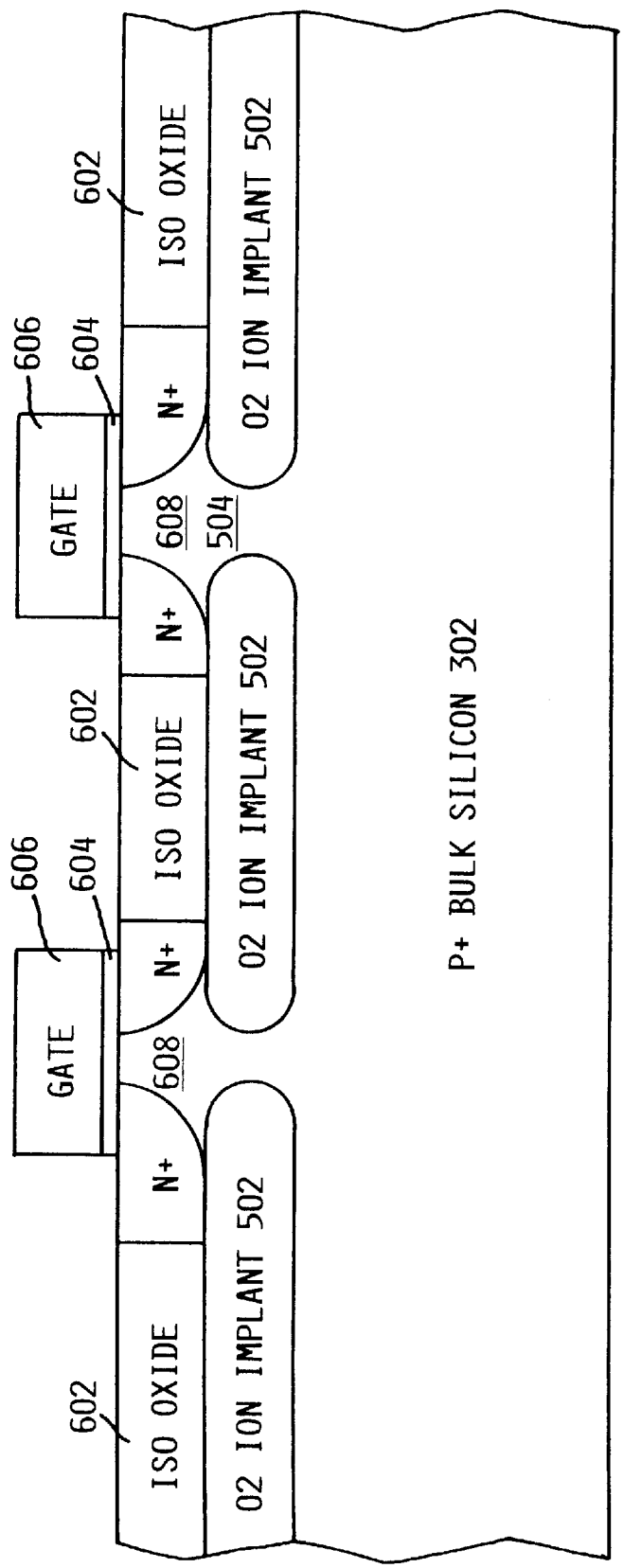

Referring to FIG. 5, next conventional processing to build, e.g., a NFET SOI transistor is continued, including a device isolation layer 602, preferably an oxide layer, a thin gate oxide 604, a polysilicon gate 606, and a body 608. Openings 504 in the buried insulating layer are aligned with the bodies 608 of the transistors.

Figure 1:
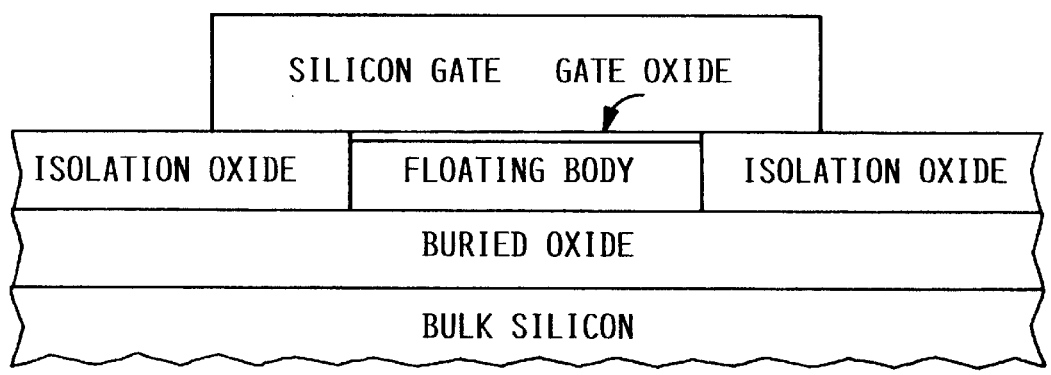
FIG. 1 illustrates a conventional SOI transistor.
Figure 2:
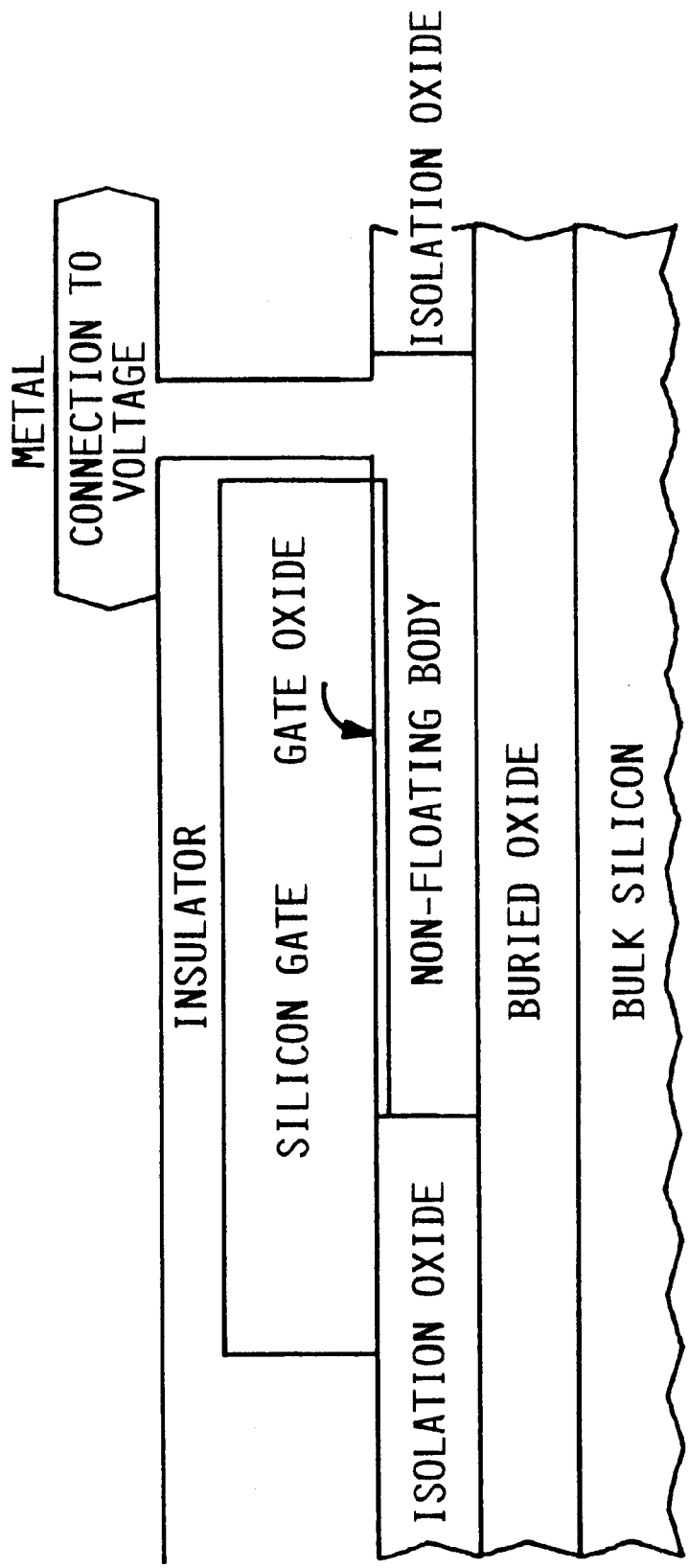
FIG. 2 illustrates a conventional SOI transistor with a conventional contact to the transistor body.
Figure 6:
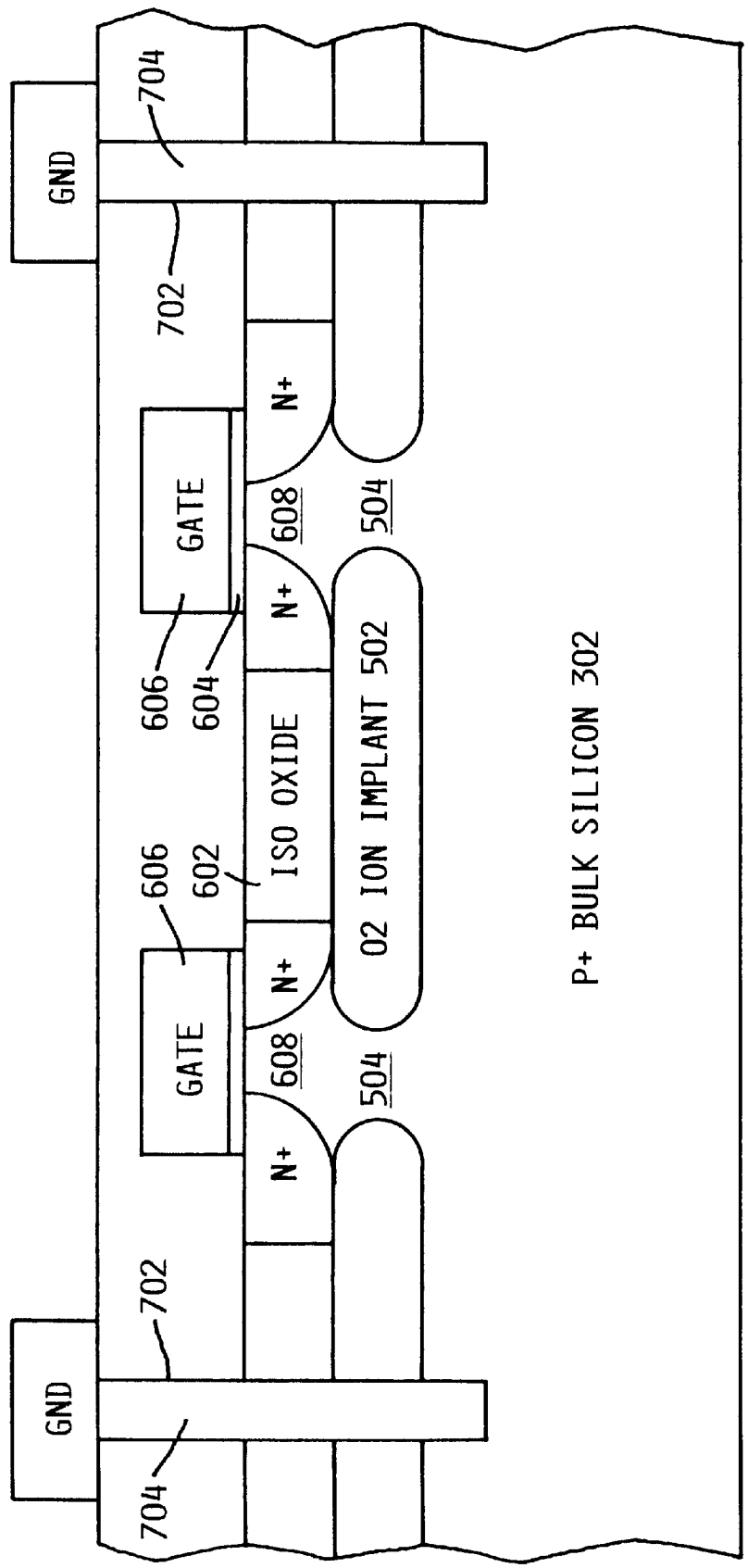

Referring to FIG. 6, prior to applying a first metallization layer at the level where ground connections are shown, deep holes 702 are simultaneously etched into the bulk silicon 302 through the isolating layers 602 and the insulating layer 502. Next the holes 702 are filled with an electrically conductive material 704, such as tungsten, copper, doped silicon, gold, or aluminum, thus creating stud contacts to these layers 402 and 302 that can be connected to voltage supplies or in some cases a varying voltage. A body contact made according to principles of the invention would have a body resistance on the order of one ohm per square or less for a total resistance of approximately ten to twenty ohms or less, as opposed to the prior art of FIG. 2 which body contact would typically have a resistance of tens of thousands of ohm per square for a total resistance of hundreds of thousands of ohms. Typically the connection to the bulk silicon 302 would be tied to ground and body contacts to NFETs would utilize this connection. If the bulk silicon was N+bulk silicon, the bulk could be tied to a high voltage supply $V_{dd}$ and PFETs could take advantage of the body contacts of the invention.

While the present invention has been described with reference to the details of the embodiments of the invention shown in the drawing, these details are not intended to limit the scope of the invention as claimed in the appended claims.

What is claimed is:

1. A method for implementing body contacts for semiconductor-on-insulator transistors comprising the steps of:
   (a) providing a bulk semiconductor substrate;
   (b) applying a mask to selected regions in said bulk semiconductor substrate, said selected regions for body contacts under a gate of the transistors;
   (c) implanting an insulator to create a buried insulating layer above said bulk semiconductor substrate; said selected regions are masked to block said implantation in said selected regions;
   (d) forming holes extending into said buried insulating layer and said bulk semiconductor substrate; and
   (e) filling said holes with an electrically conductive material to create stud contacts to said bulk semiconductor substrate to provide electrical connection to said body contacts through said bulk semiconductor substrate and said selected regions.

2. A method for implementing for semiconductor-on-insulator transistors as recited in claim 1 wherein the steps of applying said mask to said selected regions and of implanting said insulator creates the buried insulating layer with said masked regions to create openings aligned with bodies of said transistors.

3. A method for implementing body contacts for semiconductor-on-insulator transistors as recited in claim 1 wherein the step of forming holes into said bulk semiconductor substrate and said insulating layer includes the step of etching holes into said insulating layer and said bulk semiconductor substrate.

4. A method for implementing body contacts for semiconductor-on-insulator transistors as recited in claim 1 wherein said semiconductor is silicon, said insulator is oxygen, said buried insulating layer is a buried oxide layer and the step of filling said holes with the electrically conductive material to create said stud contacts to said bulk silicon substrate includes the step of filling said holes with tungsten.

5. A method for implementing body contacts for semiconductor-on-insulator transistors as recited in claim 1 wherein said semiconductor is silicon, said insulator is oxygen; said buried insulating layer is a buried oxide layer and the step of filling said holes with the electrically conductive material to create said stud contacts to said bulk silicon substrate includes the step of filling said holes with copper.

6. A method for implementing body contacts for semiconductor-on-insulator transistors as recited in claim 1 wherein said semiconductor is silicon, said insulator is oxygen, and said buried insulating layer is a buried oxide layer and the step of filling said holes with the electrically conductive material to create said stud contacts to said bulk silicon substrate includes the step of filling said holes with aluminum.

7. A method for implementing body contacts for semiconductor-on-insulator (SOI) transistors as recited in claim 1 wherein said semiconductor is silicon, said insulator is oxygen, and said buried insulating layer is a buried oxide layer, and the step of filling said holes with the electrically conductive material to create said stud contacts to said bulk semiconductor substrate includes the step of filling said holes with doped semiconductor.

8. A method for implementing body contacts for silicon-on-insulator (SOI) transistors comprising the steps of:
   (a) providing a bulk silicon substrate;
   (b) applying a mask to selected regions of said bulk silicon substrate;
   (c) implanting oxygen to said masked silicon substrate to create a buried oxide insulating layer and said masked selected regions to create openings in the buried oxide insulating layer aligned with bodies of said transistors for body contacts for the SOI transistors;
   (d) etching holes extending into said insulating layer and said bulk silicon substrate; and
   (e) filling said holes with an electrically conductive material selected from the group consisting of tungsten, copper, aluminum, gold, and doped semiconductor to create stud contacts to said bulk silicon substrate to provide electrical connection to said body contacts through said bulk silicon substrate and said openings.

* * * * *